United States Patent
Lin et al.

(10) Patent No.: US 6,350,656 B1
(45) Date of Patent: Feb. 26, 2002

(54) SEG COMBINED WITH TILT SIDE IMPLANT PROCESS

(75) Inventors: Jung-Chun Lin, Kaohsiung; Tony Lin; Jih-Wen Chou, both of Hsin-Chu, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/495,249

(22) Filed: Jan. 31, 2000

(51) Int. Cl.[7] .............................................. H01L 21/336
(52) U.S. Cl. ........................ 438/302; 438/303; 438/630
(58) Field of Search ................................. 438/301, 302, 438/303, 525, 530, 630, 664

(56) References Cited

U.S. PATENT DOCUMENTS

| | | | |
|---|---|---|---|
| 5,217,910 A | * 6/1993 | Shimizu et al. | 438/302 |
| 5,355,006 A | * 10/1994 | Iguchi | 257/296 |
| 5,733,792 A | * 3/1998 | Masuoka | 438/302 |
| 5,773,347 A | * 6/1998 | Kimura et al. | 438/302 |
| 5,883,418 A | * 3/1999 | Kimura | 257/412 |
| 6,037,232 A | * 3/2000 | Wieczorek et al. | 438/302 |

* cited by examiner

*Primary Examiner*—Olik Chaudhuri
*Assistant Examiner*—Hoai Pham
(74) *Attorney, Agent, or Firm*—Powell, Goldstein, Frazer & Murphy LLP

(57) ABSTRACT

A SEG combined with tilt implant method for forming semiconductor device is disclosed. The method includes providing a semiconductor structure which comprises an active area in between isolation regions in a substrate with the active area having a gate electrode formed thereon, wherein a spacer is formed on the sidewall of said gate electrode. Then, selective epitaxial growth regions are formed on the active area and the gate electrode. Next, the active area is implanted with an angle to form source/drain regions beside the bottom edge of the gate electrode. Then, the salicide process and backend processes are performed.

18 Claims, 4 Drawing Sheets

SEG COMBINED WITH TILT SIDE IMPLANT PROCESS

BACKGROUND OF THE INVENTION

1. Field of the Invention

The present invention generally relates to an integrated circuits fabrication, and more particularly to a SEG (selective epitaxial growth) method combined with tilt SDE (source/drain extension) implant.

2. Description of the Prior Art

As MOS (Metal-oxide-semiconductor) devices scaled down to sub 0.1 micron, in order to maintain the performance gain and device characteristics, some aggressive modules have been proposed, such as SEG (selective epitaxial growth) on silicon substrate and polysilicon.

Referring to FIG. 1, a cross-sectional view of a conventional MOS device with SEG is shown there. A well 110 between two isolation regions 120 is in a substrate 100, in which isolation regions 120 are shallow trench isolations. Source/drain regions 112 on the surface of an active area are separated by a gate electrode 116, and SDE (source/drain extension) regions 114 are underlying a spacer 122 near gate electrode 116. Regions 118 on the source/drain regions 112 and gate 116 are formed by SEG.

The method for forming the MOS device in FIG. 1 comprises the steps of first providing the substrate 100 with the active area defined therein and forming shallow trench isolation regions 120 besides the active area. Then, the well 110 is formed by implantation in the active area. Next, a gate oxide layer and the gate electrode 116 are successively formed on the active area. Then, the SDE regions 114 are formed in the active area by using gate 116 as a mask. After that, the spacers 112 are formed on the two sides of the gate 116. Next, the SEG regions 118 are formed on the source/drain regions 112 and gate 116, and the source/drain regions 112 are formed sequentially by using implantation. The follow-up process that have been carried out after the formation of the MOS device are salicide (self-aligned silicide) process and the backend process.

Conventional process is very complicated, because the formulation of SDE regions and source/drain regions needs two implantation steps and two lithography steps (one for NMOS and another for PMOS). Moreover, under such process, the ultra shallow junction can not be reached.

SUMMARY OF THE INVENTION

In accordance with the present invention, a SEG combined with tilt SDE implant method is provided for forming a MOS device that substantially reduces source/drain implantation and lithography steps, because SDE and source/drain implant can be preformed in one step. Moreover, the MOS device can reach ultra shallow junction with the aid of SEG combined with tilt SDE implantation.

It is another object of this invention that the capacitance of the overlapping region between gate and drain can be adjust by the spacer width and the tilt angle for achieving a better performance.

It is a further object of this invention that SDE implant after the formation of the spacer can avoid the thermal cycle of spacer step for achieving ultra shallow junction and reducing the out diffusion of Boron.

In one embodiment, a SEG combined with tilt implant method for forming semiconductor device includes providing a substrate with an active area defined therein, and then forming shallow trench isolation regions around the active area. Then, a well is formed in the active area, and a gate electrode is subsequently formed on the active area. Next, spacers are formed on the sidewall of the gate electrode. As a key step of the invention, selective epitaxial growth regions are formed on the active area and the gate electrode, and then the active area is implanted with an angle to form source/drain regions beside the bottom edge of the gate electrode. Next, the source/drain regions are annealed such that the source/drain regions diffuse to the regions underlying the gate electrode. Then, the salicide process and backend processes are performed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
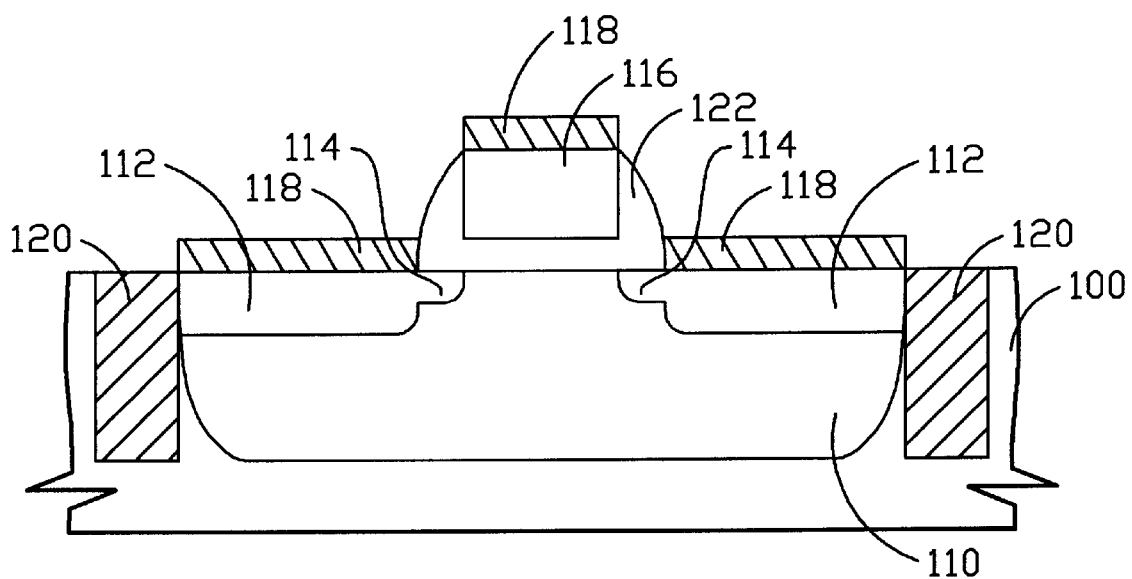
FIG. 1 is a schematic representation of a MOS device formed by SEG using conventional, prior art techniques.

Some sample embodiments of the present invention will now be described in a greater detail. Nevertheless, it should be recognized that the present invention can be practiced in a wide range of other embodiments besides those explicitly described, and the scope of the present invention is expressly not limited except as specified in the accompanying claims.

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

In the present invention, SEG is proceeded followed by spacer formation, and then deep source/drain and SDE implant are performed simultaneously. Suitable conditions for performing the various steps are set forth below and will be explained in reference to FIG. 2 to FIG. 8.

Figure 2:
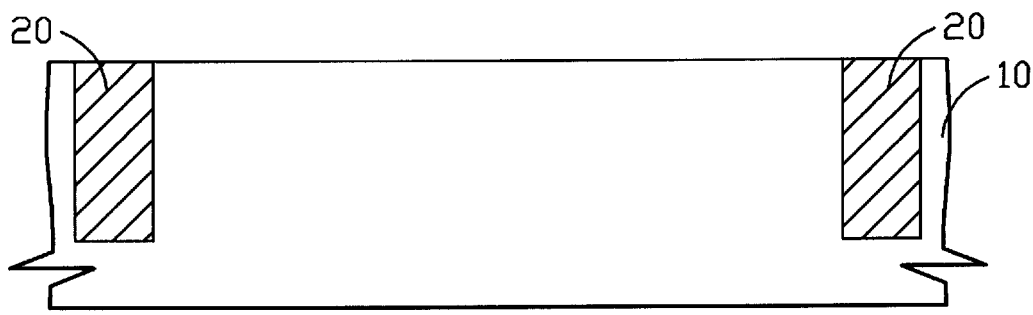
FIG. 2 is a schematic representation showing the formulation of defining active area and shallow trench isolation according to the present invention disclosed herein.

Referring to FIG. 2, a substrate 10 is provided with an active area defined therein, and shallow trench isolation regions 20 are formed around the active region. In this embodiment, the substrate 10 comprises silicon and the shallow trench isolation regions 20 are isolation regions to isolate the electric connection from the active area to another area. The method for forming shallow trench isolation regions 20 is depositing a silicon nitride layer on the active area and then etching the substrate 10 by using the silicon nitride layer as a mask. After the substrate 10 has been etched, the silicon nitride layer is removed, and the trench is filled with silicon oxide which is formed by any conventional method, such as thermal oxide method, for achieving the isolation. A field implant region is always formed underlying the shallow trench isolation regions 20 for increasing the isolation.

Figure 3:
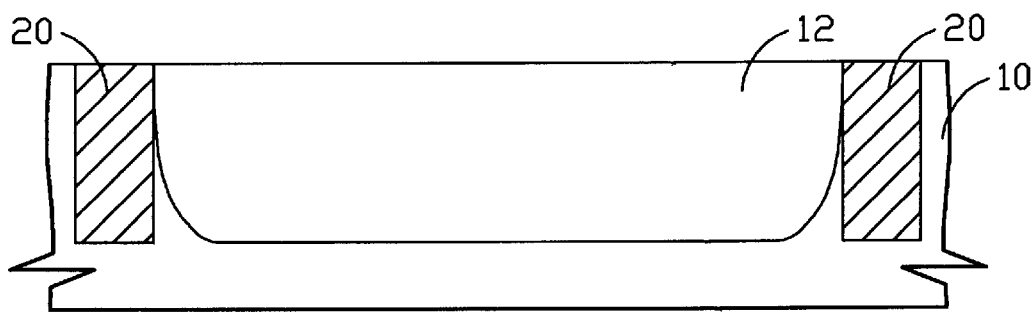
FIG. 3 is a schematic representation showing the formulation of well in the active area according to the present invention disclosed herein.

Referring to FIG. 3, a well 12 is formed in the active area and is formed by using any conventional implantation. The formation of a channel and an anti-punch through region (not shown in all FIGS.) in MOS device are performed at this step, and these two steps are not critical to the present invention.

Figure 4:
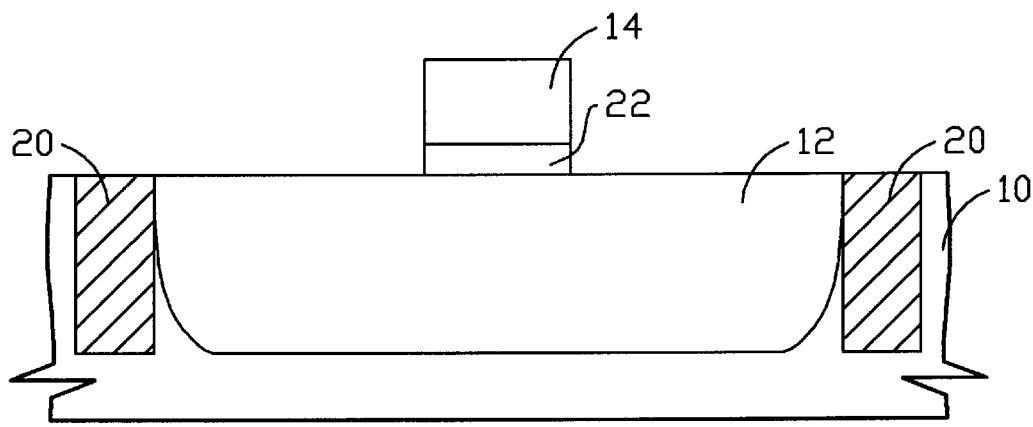
FIG. 4 is a schematic representation showing the formulation of gate oxide layer and gate electrode on the active area according to the present invention disclosed herein.

Referring to FIG. 4, a gate oxide layer 22 and a gate electrode 14 are formed on the active area. The gate oxide layer 22 is formed by thermal oxide method on the active area, and the thickness of this oxide layer is used to control the threshold voltage of the MOS device. The gate electrode 14 is formed by depositing a polysilicon layer by using any conventional method, and then the polysilicon layer is etched by conventional lithography to form gate oxide 22 and gate electrode 14.

Figure 5:
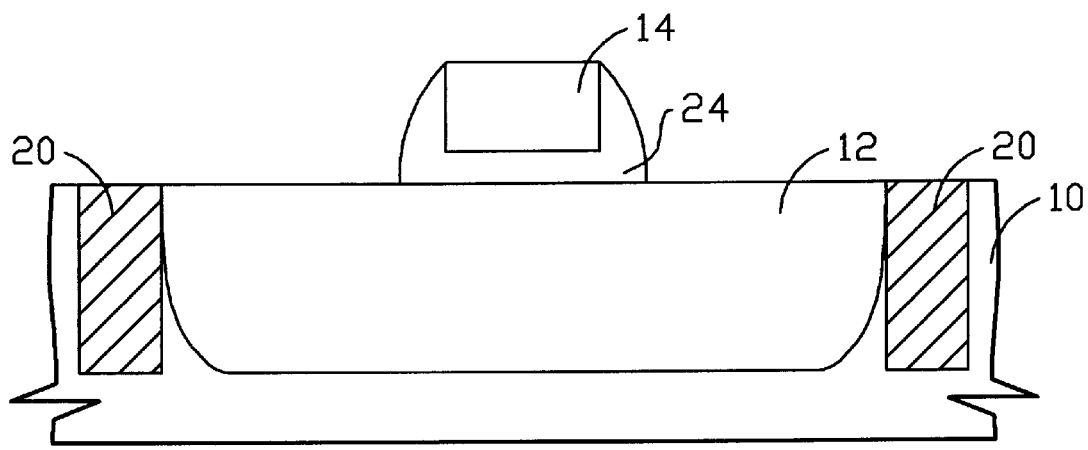
FIG. 5 is a schematic representation showing the formulation of spacers beside the gate according to the present invention disclosed herein.

Referring to FIG. 5, spacers 24 are formed on the sidewall of the gate 14. The prior method of this step is followed by SDE implant, but the present invention can reduce the step of SDE implant. In the present embodiment, a silicon oxide layer is deposited on the active area and gate 14 by using any kind of chemical vapor deposition method, and then etched isotropically to a thickness to form the spacers. Because both gate oxide 22 and spacers 24 are silicon oxide, though the formulation is different, they will not be divided into two parts in FIGS.

Figure 6:
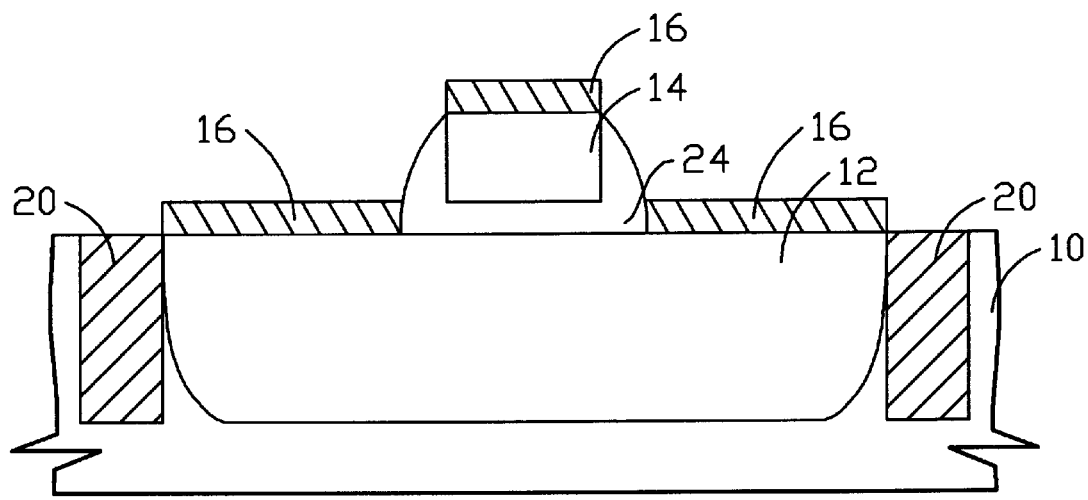
FIG. 6 is a schematic representation showing the formulation of SEG regions on the active area and the gate electrode according to the present invention disclosed herein.

The following two steps are the key steps of the present invention. Referring to FIG. 6, SEG regions 16 are formed on the active area and gate electrode 14 by using conventional SEG method. Owing to the substrate 10 and polygate 14 provide silicon as seeds for the SEG method, the SEG regions 16 only grow on the substrate 10 and polygate 14. The thickness of the SEG regions 16 not only controls the following junction depth, but also compensates the consumption of silicon while performing salicide process.

Figure 7:
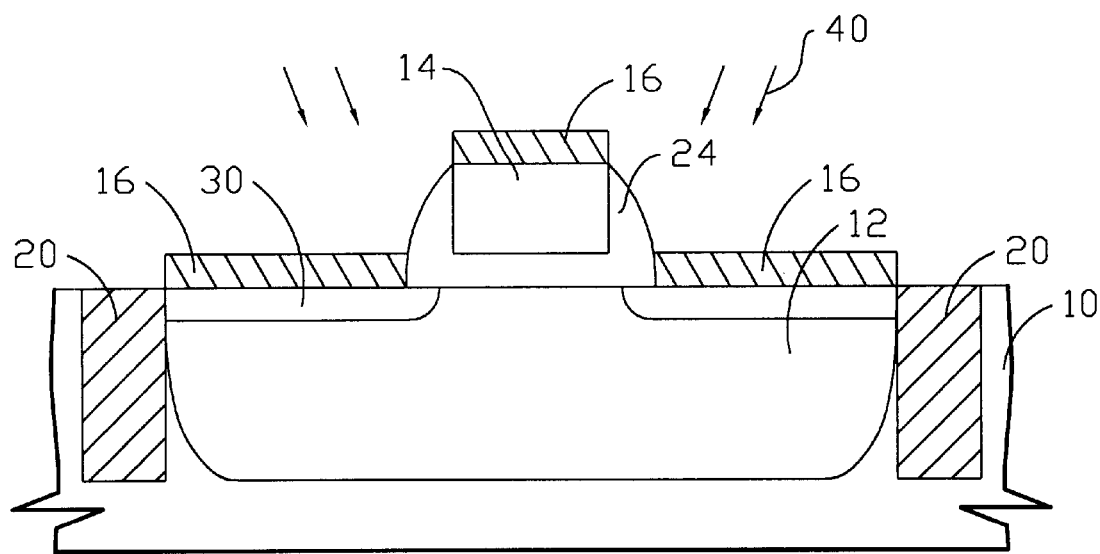
FIG. 7 is a schematic representation showing the formulation of source/drain by using tile implant according to the present invention disclosed herein.

Referring to FIG. 7, the source/drain regions 30 are formed by tilt implant. Because the SEG regions 16 are formed on the active area, this implant 40 can be controlled easily to form ultra shallow junction. Since the implant energy controls the junction depth, the implant energy in this embodiment is between about 1 Kev to 5 Kev. During the implantation, the implant 40 is tilt implant, and the implant region can extent to the region underlying spacers 24; that is, source/drain regions 30 can extent to the regions underlying the spacers 24 and the step for forming SDE can be reduced.

Figure 8:
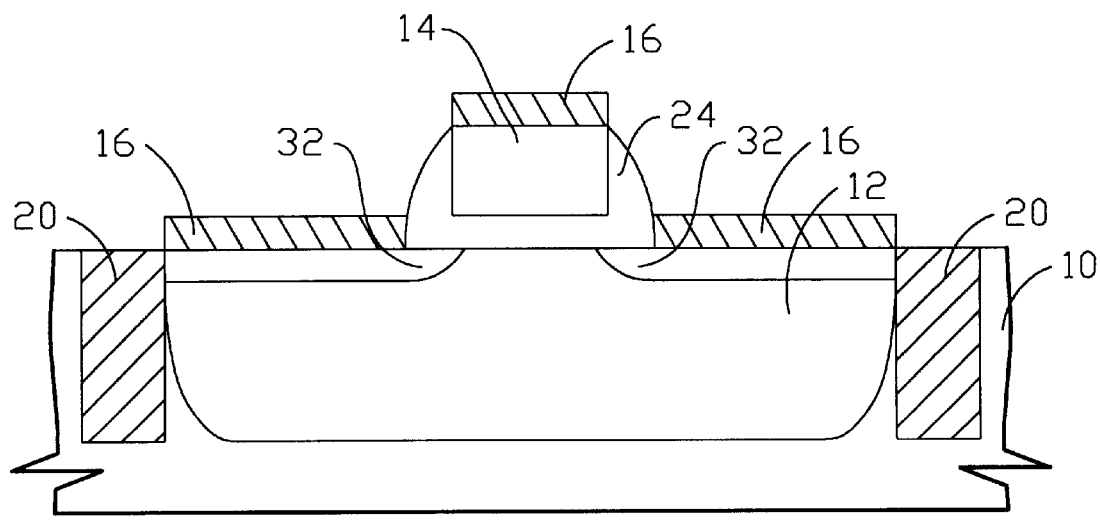
FIG. 8 is a schematic representation showing the formulation of SDE regions by using annealing to drive-in according to the present invention disclosed herein.

Referring to FIG. 8, the source/drain regions 30 are annealed, and the implant regions underlying the spacers 24 are diffused to the region underlying the gate 14 to form SDE regions 32. The method for annealing is achieved by putting the wafer into a furnace for a period of time. This annealing step also replaces spacer thermal cycle. Prior spacer is formed after forming SDE regions, and the spacer thermal cycle will generate the out-diffusion of Boron. In the present invention, all thermal cycles are completed in this step and can reduce the out-diffusion of Boron. Then, the follow-up process that have been carried out after the formation of the MOS device are salicide (self-aligned silicide) process and the backend process.

The present invention provides a SEG method combined with tilt implant for forming MOS devices that can substantially reduces source/drain implantation and lithography steps. In addition, the MOS devices can reach ultra shallow junction with the aid of SEG combined with tilt SDE implantation. Furthermore, the capacitance of the overlap region between gate and drain can be adjusted by spacer width and the tilt angle for achieving a better performance. Moreover, SDE implant after the formation of spacer can avoid the thermal cycle of spacer step to achieve ultra shallow junction and reduce the out-diffusion of Boron.

Although specific embodiments have been illustrated and described, it will be obvious to those skilled in the art that various modifications may be made without departing from what is intended to be limited solely by the appended claims.

What is claimed is:

1. A method for forming a semiconductor device, said method comprising:

providing a semiconductor structure having an active area in between isolation regions which are formed in a substrate, and said active area has a gate electrode formed thereon, wherein a spacer is formed on the sidewall of said gate electrode;

forming selective epitaxial growth regions on said active area and said gate electrode; and implanting ions into said active area with an angle to form source/drain regions underlying said spacer on the sidewall of said gate electrode.

2. The method according to claim 1, wherein said substrate comprises silicon.

3. The method according to claim 1, wherein said isolation regions comprise shallow trench isolation.

4. The method according to claim 1, wherein said gate electrode comprises a gate oxide layer for isolating said gate electrode from said substrate.

5. The method according to claim 1, further comprising a step of annealing said substrate after forming said source/drain regions such that said source/drain regions diffuse to the regions underlying said gate electrode.

6. The method according to claim 5, further comprising performing salicide process to said source/drain and said gate electrode.

7. The method according to claim 1, wherein said active area comprises a well.

8. A method for forming a semiconductor device, said method comprising:

providing a substrate having an active area therein, wherein said active area is located in between isolation regions;

forming a gate electrode on said substrate;

forming selective epitaxial growth regions on said active area and said gate electrode;

implanting ions into said active area with an angle to form source/drain regions beside the bottom edge of the gate electrode; and annealing said source/drain regions such that said source/drain regions diffuse to the regions underlying said gate electrode, so as to form source/drain extension regions.

9. The method according to claim 8, wherein said substrate comprises silicon.

10. The method according to claim 8, wherein said isolation regions comprise shallow trench isolation.

11. The method according to claim 8, wherein said gate electrode comprises a gate oxide layer for isolating said gate electrode from said substrate.

12. The method according to claim 8, wherein said active area comprises a well.

13. The method according to claim 8, further comprising performing salicide process to said source/drain and said gate electrode.

14. A method for forming semiconductor device by using selective epitaxial growth combined with tilt implant, said method comprising:

providing a substrate with an active area defined therein;

forming shallow trench isolation regions around said active area;

forming a well in said active area;

forming a gate electrode on said active area;

forming spacers on the sidewall of said gate electrode;

forming selective epitaxial growth regions on said active area and said gate electrode;

implanting ions into said active area with an angle to form source/drain regions underlying said spacers on the sidewall of said gate electrode; and annealing said source/drain regions such that said source/drain regions diffuse to the regions underlying said gate electrode, so as to form source/drain extension regions.

15. The method according to claim 14, wherein said substrate comprises silicon.

16. The method according to claim 14, wherein said isolation regions comprise shallow trench isolation.

17. The method according to claim 14, wherein said gate electrode comprises a gate oxide layer for isolating said gate electrode from said substrate.

18. The method according to claim 14, further comprising performing salicide process to said source/drain and said gate electrode.

* * * * *